(12) United States Patent
Fernandez et al.

(10) Patent No.: US 8,183,161 B2
(45) Date of Patent: May 22, 2012

(54) METHOD AND SYSTEM FOR DRY ETCHING A HAFNIUM CONTAINING MATERIAL

(75) Inventors: Luis Isidro Fernandez, Somerville, MA (US); Masafumi Urakawa, Salem, MA (US)

(73) Assignee: Tokyo Electron Limited, Tokyo (JP)

( * ) Notice: Subject to any disclaimer, the term of this patent is extended or adjusted under 35 U.S.C. 154(b) by 491 days.

(21) Appl. No.: 11/518,890

(22) Filed: Sep. 12, 2006

(65) Prior Publication Data

US 2008/0064220 A1   Mar. 13, 2008

(51) Int. Cl.
*H01L 21/302* (2006.01)
(52) U.S. Cl. ........ 438/714; 438/706; 438/710; 438/715; 438/722; 216/67
(58) Field of Classification Search .................. 438/706, 438/710, 714, 719, 720, 723, 724, 725; 216/67
See application file for complete search history.

(56) References Cited

U.S. PATENT DOCUMENTS

| | | | | |
|---|---|---|---|---|
| 5,741,396 | A * | 4/1998 | Loewenstein | 438/724 |
| 6,511,872 | B1 * | 1/2003 | Donnelly et al. | 438/197 |
| 6,670,278 | B2 * | 12/2003 | Li et al. | 438/710 |
| 2003/0211748 | A1 * | 11/2003 | Jin et al. | 438/709 |
| 2004/0014327 | A1 | 1/2004 | Ji et al. | |
| 2004/0140504 | A1 * | 7/2004 | Hsu et al. | 257/341 |
| 2004/0206724 | A1 | 10/2004 | Nallan et al. | |
| 2004/0209468 | A1 * | 10/2004 | Kumar et al. | 438/689 |
| 2005/0081781 | A1 * | 4/2005 | Lin et al. | 117/104 |
| 2005/0164479 | A1 * | 7/2005 | Perng et al. | 438/591 |
| 2005/0176191 | A1 | 8/2005 | Kumar et al. | |
| 2005/0181590 | A1 * | 8/2005 | Chiu et al. | 438/595 |
| 2006/0214244 | A1 * | 9/2006 | Minakata | 257/410 |
| 2006/0252265 | A1 * | 11/2006 | Jin et al. | 438/689 |
| 2007/0099403 | A1 * | 5/2007 | Shamiryan et al. | 438/513 |

OTHER PUBLICATIONS

Office Action issued Oct. 27, 2011, in Chinese Patent Application No. 200780033566.2 (With English Translation).
Notification of Examination Opinions (with English translation), dated Dec. 19, 2011, issued in counterpart Taiwan Application No. 096132999.

* cited by examiner

*Primary Examiner* — Lan Vinh
*Assistant Examiner* — Jiong-Ping Lu
(74) *Attorney, Agent, or Firm* — Oblon, Spivak, McClelland, Maier & Neustadt, L.L.P.

(57) ABSTRACT

A method and system for etching a hafnium containing material using a boron tri-chloride ($BCl_3$) based process chemistry is described. A substrate having a hafnium containing layer, such as a layer of hafnium dioxide ($HfO_2$) is subjected a dry etching process comprising $BCl_3$ and an additive gas including: an oxygen-containing gas, such as $O_2$; or a nitrogen-containing gas, such as $N_2$; or a hydrocarbon gas ($C_xH_y$), such as $CH_4$; or a combination of two or more thereof.

20 Claims, 14 Drawing Sheets

METHOD AND SYSTEM FOR DRY ETCHING A HAFNIUM CONTAINING MATERIAL

FIELD OF THE INVENTION

The present invention relates to a method and system for etching a hafnium containing layer on a substrate using a dry plasma process, and more particularly to a method and system for etching a hafnium containing layer using a process gas comprising $BCl_3$ and an additive gas.

BACKGROUND OF THE INVENTION

As is known to those in the semiconductor art, the reduction in size of semiconductor devices has been indispensably necessary in order to cause an increase in device performance and a decrease in power consumption. Accordingly, process development and integration issues are key challenges for new gate stack materials and silicide processing, with the imminent replacement of $SiO_2$ and Si-oxynitride ($SiN_xO_y$) with high-permittivity dielectric materials (also referred to herein as "high-k" materials), and the use of alternative gate electrode materials to replace doped poly-Si in sub-0.1 μm complementary metal-oxide semiconductor (CMOS) technology. Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiN_xO_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). During the manufacturing of semiconductor devices, the high-k layers must be etched and removed in order to allow silicidation for the source/drain regions, and to reduce the risk of metallic impurities being implanted into the source/drain regions during ion implantation. However, these materials must be etched while minimizing damage to the gate structure, etc.

SUMMARY OF THE INVENTION

The present invention relates to a method and system for etching a hafnium containing layer on a substrate. The method comprises using a process composition having $BCl_3$ and an additive gas. The additive gas may comprise an oxygen-containing gas, a nitrogen containing gas, or a hydrocarbon containing gas, or a combination of two or more thereof.

According to one embodiment, a method of etching a hafnium containing layer on a substrate, and a computer readable medium containing instructions for executing the method, are described, comprising: disposing the substrate having the hafnium containing layer in a plasma processing system, wherein a mask layer defining a pattern therein overlies the hafnium containing layer; elevating the temperature of the substrate above approximately 30 degrees C.; introducing a process composition comprising a $BCl_3$ and an additive gas to the plasma processing system; forming a plasma from the process composition in the plasma processing system; and exposing the substrate to the plasma in order to etch the pattern into the hafnium containing layer. The additive gas may comprise an oxygen-containing gas, a nitrogen containing gas, or a hydrocarbon containing gas, or a combination of two or more thereof.

According to another embodiment, a plasma processing system for etching a hafnium containing layer on a substrate is described, comprising: a plasma processing chamber for facilitating the formation of a plasma from a process composition in order to etch the hafnium containing layer; and a controller coupled to the plasma processing chamber and configured to execute a process recipe utilizing the process composition, the process composition comprises $BCl_3$ and an additive gas comprising an oxygen containing gas, a nitrogen containing gas, or a hydrocarbon gas, or a combination of two or more thereof.

DETAILED DESCRIPTION OF SEVERAL EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

During pattern etching, a dry plasma etching process is often utilized, wherein plasma is formed from a process gas by coupling electro-magnetic (EM) energy, such as radio frequency (RF) power, to the process gas in order to heat electrons and cause subsequent ionization and dissociation of the atomic and/or molecular composition of the process gas. Using a series of dry etching processes, the pattern formed in the initial mask layer, using for instance a photo-lithographic process as described above, is transferred to the underlying layers within a film stack, including the one or more material layers that are desired for the end product, e.g., electronic device.

Figure 1A:
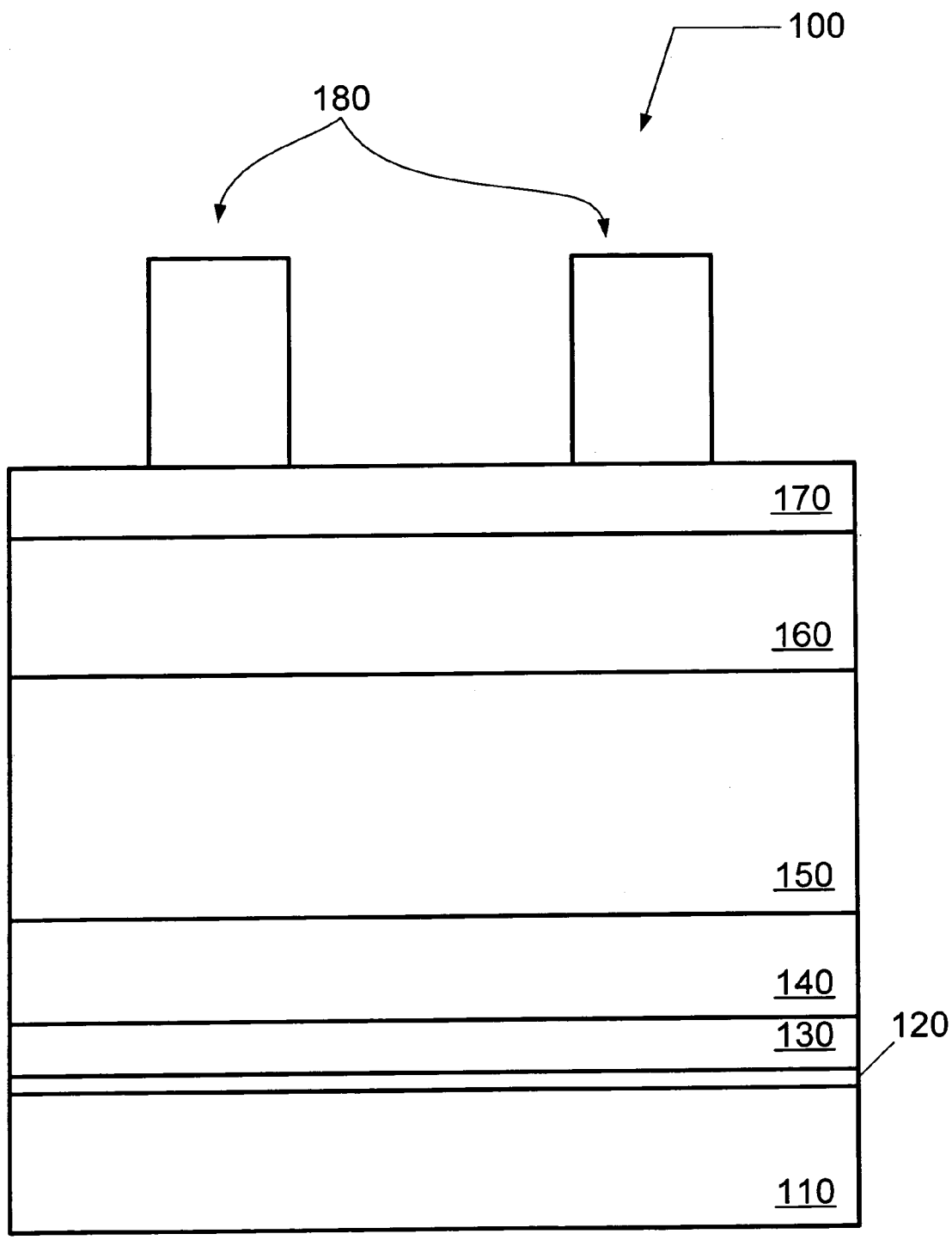
FIGS. 1A, 1B, and 1C illustrate a schematic representation of a procedure for pattern etching a film stack according to an embodiment.
Figure 1B:
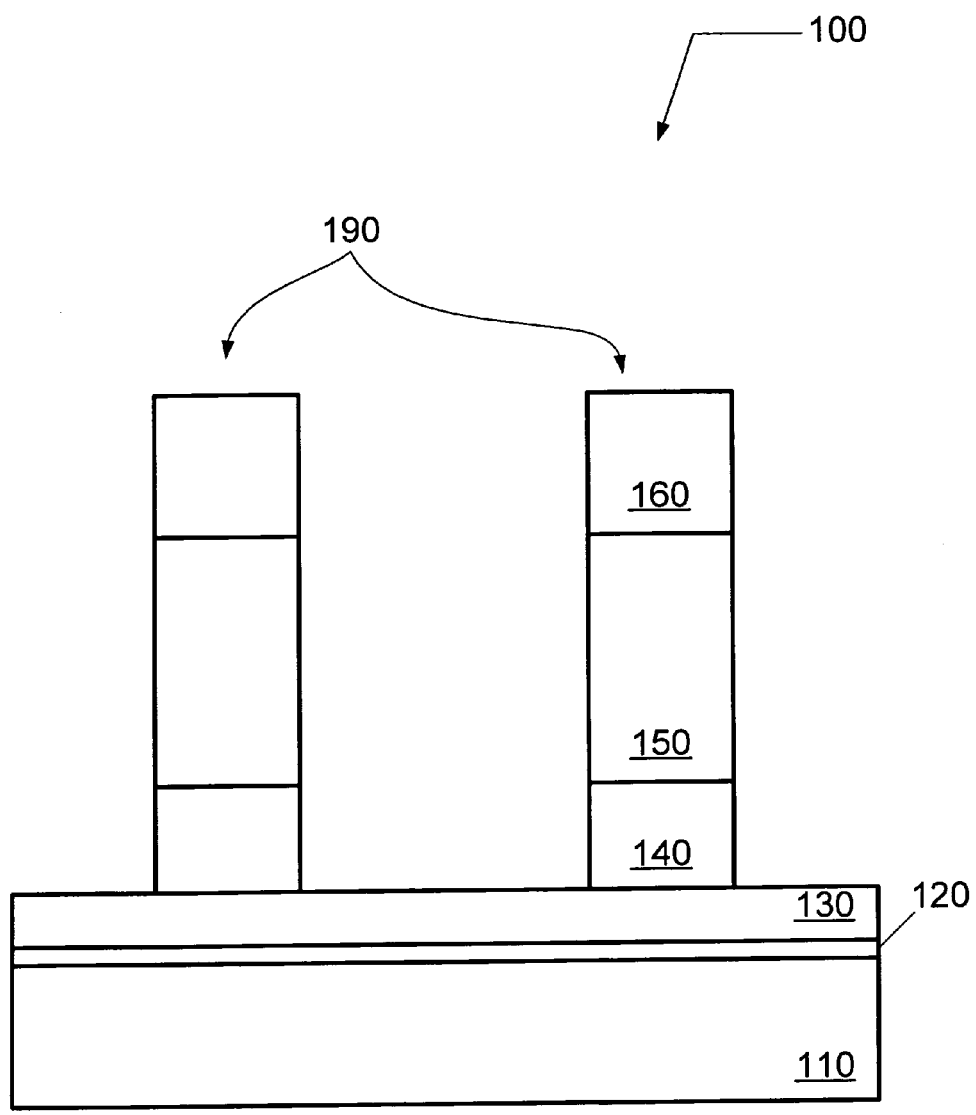
Figure 1C:
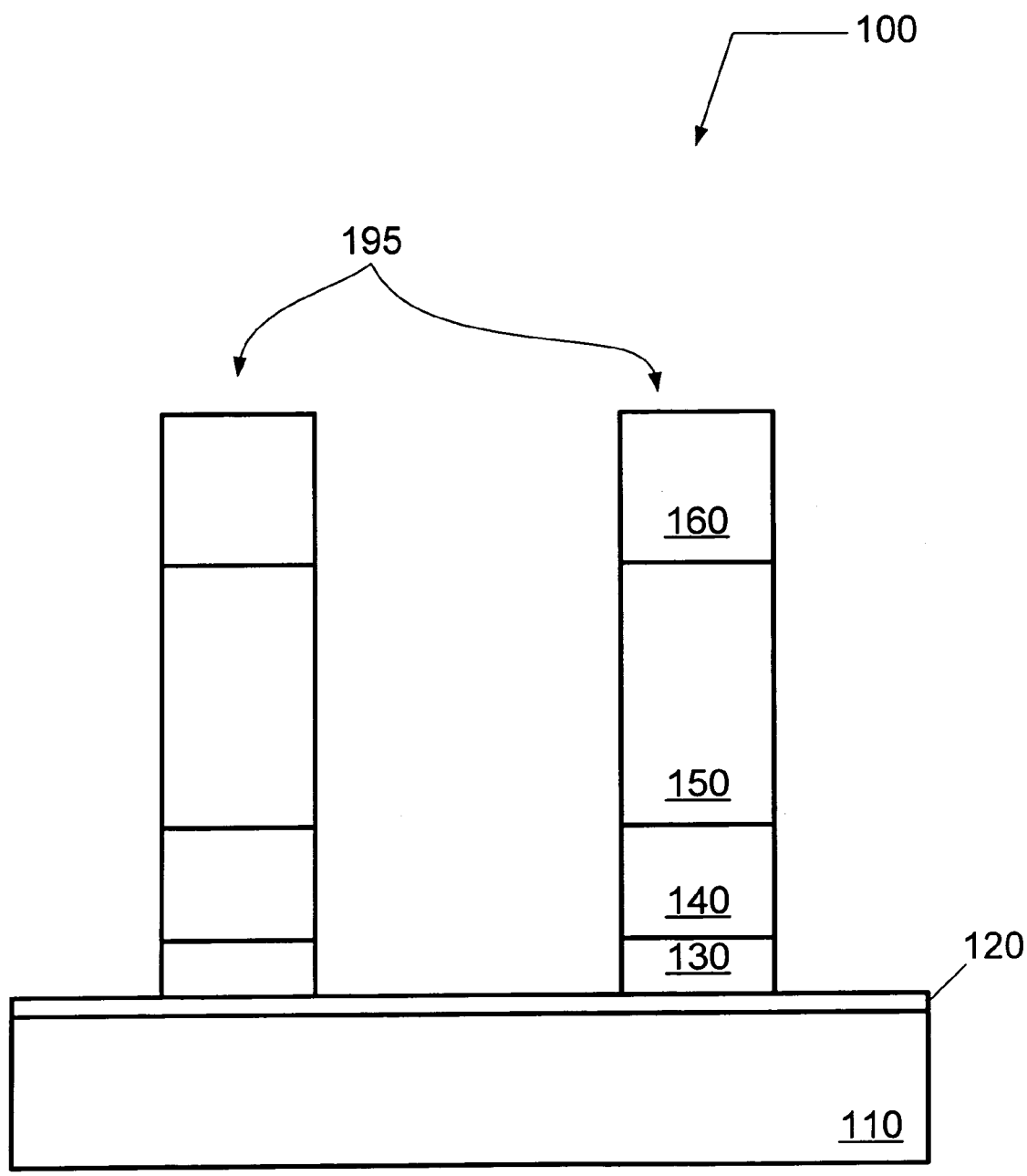

For example, as shown in FIGS. 1A through 1C, a film stack 100 comprising a plurality of layers 120 through 170 formed on a substrate 110 is illustrated. The film stack 100 may, for example, include a polycrystalline silicon (polysilicon, or poly-Si) gate stack having a polysilicon layer 150, a metal or metal-containing layer 140, and a high dielectric constant (high-k) dielectric layer 130 as the gate dielectric or part of the gate dielectric. The metal-containing layer 140 can, for example, be part of a metal/poly-Si gate electrode. The metal-containing layer 140 may be several hundred Angstroms (Å) thick, for instance, about 100 Å thick, and it can contain W, WN, $WSi_x$, Al, Mo, MoN, Ta, TaN, TaSiN, HfN, HfSi, HfSiN, Ti, TiN, TiSiN, Re, Ru, or Pt. The introduction of metal gate electrodes to replace or to be integrated with the traditional poly-Si gate electrode layer can bring about several advantages, including elimination of the poly-silicon gate depletion effect, reduction in sheet resistance, better reliability and potentially better thermal stability on advanced high-k layers. For example, the gate dielectric may further include an interfacial layer 120, such as a thin layer of silicon dioxide ($SiO_2$) between the high-k layer and the substrate. The high-k dielectric layer 130 may, for example, comprise a hafnium containing layer, such as a hafnium oxide layer (e.g., $HfO_2$) or hafnium silicate layer (e.g., HfSiO).

The film stack 100 further comprises a patterned mask layer 180, such as a layer of photo-resist having a pattern formed therein using a photo-lithographic process. Additionally, for example, the film stack 100 may include an anti-reflective coating (ARC) layer 170 for use in patterning the mask layer 180, and one or more hard mask layers 160, such as a silicon dioxide ($SiO_2$) hard mask for dry etching the polysilicon layer 150.

As illustrated in FIGS. 1B and 1C, the series of etching processes for transferring the pattern to the underlying stack of films is selected to preserve the integrity of the pattern being transferred, e.g., critical dimensions, etc., as well as minimize damage to those layers which are utilized in the electronic device being fabricated. One critical etch process includes the transfer of the pattern to the high-k dielectric film 130 without damaging, for example, the poly-Si layer 150 or the underlying $SiO_2$ interfacial layer 120 or both.

Conventional processes for etching a hafnium containing high-k layer include using $HBr/Cl_2$-based process chemistries. However, these etch chemistries are known to etch the poly-Si layer 150 and the underlying $SiO_2$ interfacial layer 120. For example, when using a $HBr/Cl_2$-based process chemistry, the inventors have observed an etch selectivity between $HfO_2$ and poly-Si larger than 10, yet they have observed an etch selectivity between $HfO_2$ and $SiO_2$ ranging only from 1.5 to 2.5.

According to one embodiment, the pattern etching process for transferring a pattern into high-k dielectric layer 130 comprises introducing a process composition comprising $BCl_3$ and an additive gas. The additive gas is expected to serve as a passivation gas, whereby the additive gas provides passivation of surfaces where etching is undesirable. Thus, the pattern etching process can provide improvements in the etch selectivity between $HfO_2$ and those materials where etching is not intended such as poly-Si and $SiO_2$, for example.

The additive gas can comprise an oxygen containing gas, a nitrogen containing gas, or a hydrocarbon gas (characterized by $C_xH_y$, wherein x and y are integers greater than or equal to unity), or a combination of two or more thereof. For example, the oxygen containing gas can comprise $O_2$, NO, $NO_2$, $N_2O$, CO, or $CO_2$, or a combination of two or more thereof. Additionally, for example, the nitrogen containing gas can comprise $N_2$, or $NH_3$, or a combination of two or more thereof. Furthermore, the hydrocarbon gas can comprise $C_2H_4$, $CH_4$, $C_2H_2$, $C_2H_6$, $C_3H_4$, $C_3H_6$, $C_3H_8$, $C_4H_6$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition can further include an inert gas, such as a noble gas (e.g., He, Ne, Ar, Kr, Xe).

Figure 2:
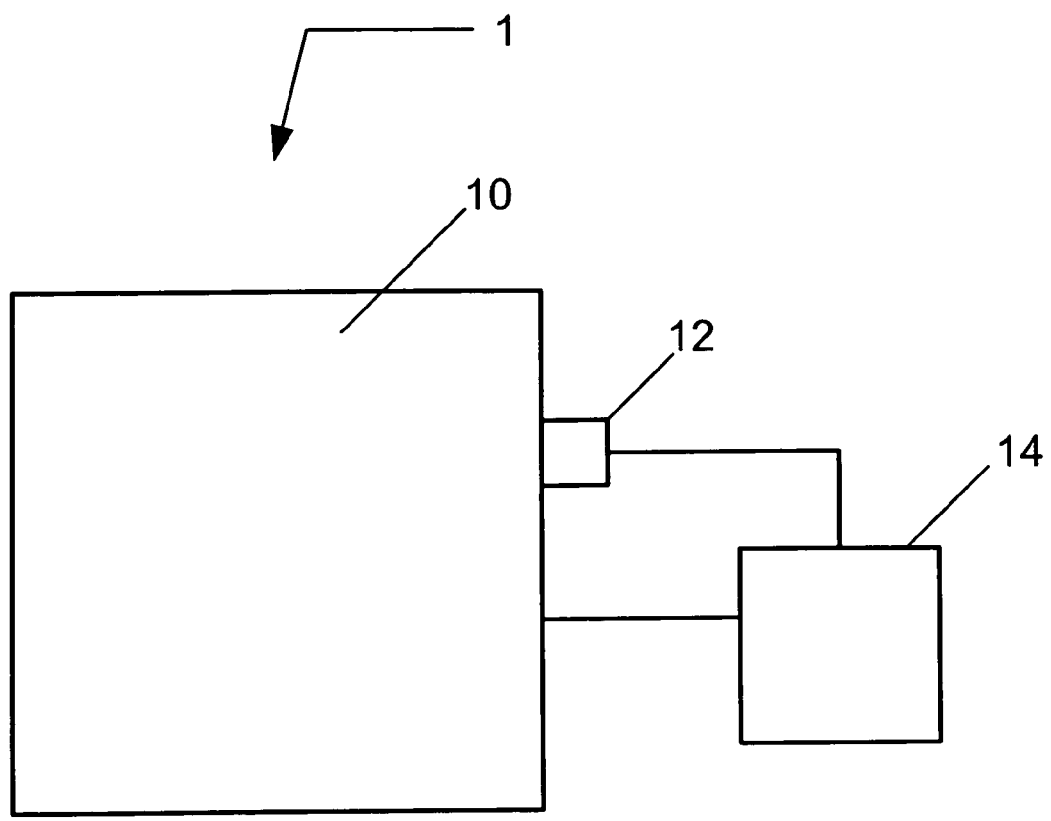
FIG. 2 shows a simplified schematic diagram of a plasma processing system according to an embodiment.

According to one embodiment, a plasma processing system 1 is depicted in FIG. 2 comprising a plasma processing chamber 10, an optional diagnostic system 12 coupled to the plasma processing chamber 10, and a controller 14 coupled to the optional diagnostic system 12 and the plasma processing chamber 10. The controller 14 is configured to execute a process recipe comprising at least one step configured to etch a hafnium containing layer using plasma formed from the introduction of a process composition comprising $BCl_3$ and an additive gas, as described above. Additionally, controller 14 is optionally configured to receive at least one endpoint signal from the diagnostic system 12 and to post-process the at least one endpoint signal in order to accurately determine an endpoint for the process. Alternatively, controller 14 utilizes a pre-determined time to set the endpoint of the process. In the illustrated embodiment, plasma processing system 1, depicted in FIG. 2, utilizes plasma for material processing. Plasma processing system 1 can comprise an etch chamber.

Figure 3:
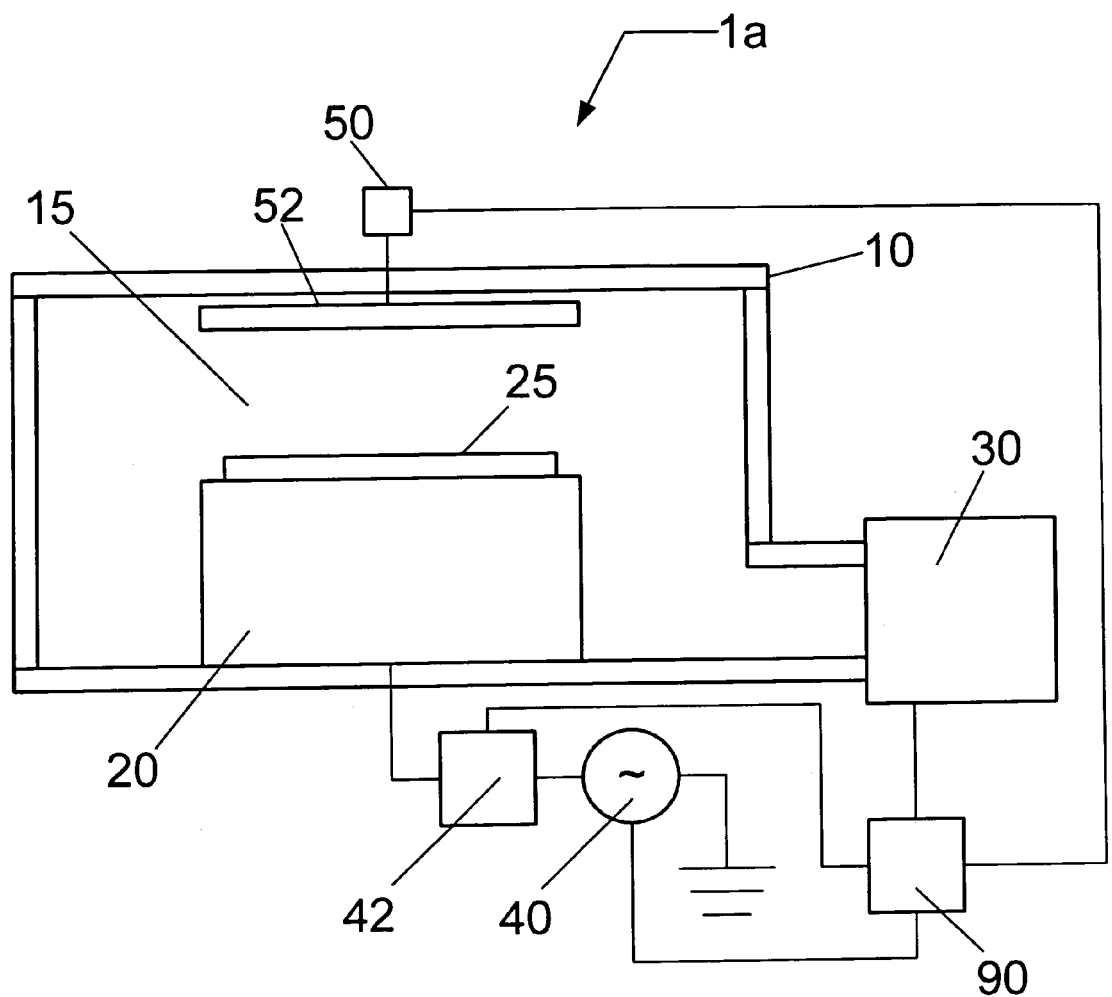
FIG. 3 shows a schematic diagram of a plasma processing system according to another embodiment.

FIG. 3 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a temperature control system for controlling the temperature of substrate 25 during various etching processes. For example, during an etching process for etching a high-k dielectric layer, such as a hafnium containing layer, the temperature control system comprises a heating system configured to elevate the temperature of substrate 25 to approximately 30 degrees C. or greater. Alternatively, the temperature control system comprises a heating system configured to elevate the temperature of substrate 25 to approximately 50 degrees C. or greater. Alternatively, the temperature control system comprises a heating system configured to elevate the temperature of substrate 25 to approximately 75 degrees C. or greater. Alternatively, the temperature control system comprises a heating system configured to elevate the temperature of substrate 25 to approximately 100 degrees C. or greater. Alternatively yet, the temperature control system comprises a heating system configured to elevate the temperature of substrate 25 to approximately 200 degrees C. or greater. For example, the substrate temperature may range from approximately 50 degrees C. to approximately 250 degrees, and can range from approximately 50 degrees C. to approximately 100 degrees C.

Additionally for example, during an etching process for etching a poly-Si layer, the temperature control system comprises a heating system configured to elevate the temperature of substrate 25 to approximately 100 degrees C. or less. Further yet for example, during an etching process for etching a $SiO_2$ layer, the temperature control system comprises a cooling system configured to reduce or maintain the temperature of substrate 25 at approximately 20 to 30 degrees C.

The substrate holder 20 can comprise a temperature control system having a cooling system or a heating system or both. For instance, the cooling system or heating system can include a re-circulating fluid flow that receives heat from substrate holder 20 and transfers heat to a heat exchanger system (not shown) when cooling, or transfers heat from the heat exchanger system to the fluid flow when heating. Additionally, for instance, the cooling system or heating system may comprise heating/cooling elements, such as resistive heating elements, or thermoelectric heaters/coolers located within the substrate holder 20

Moreover, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

In other embodiments, heating/cooling elements, such as resistive heating elements, or thermo-electric heaters/coolers can be included in the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber can serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 3, plasma processing system 1a optionally comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 3, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, optional DC power supply 50, the gas injection system (not shown), vacuum pumping system 30, as well as the backside gas delivery system (not shown), the substrate/substrate holder temperature control system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

Figure 4:
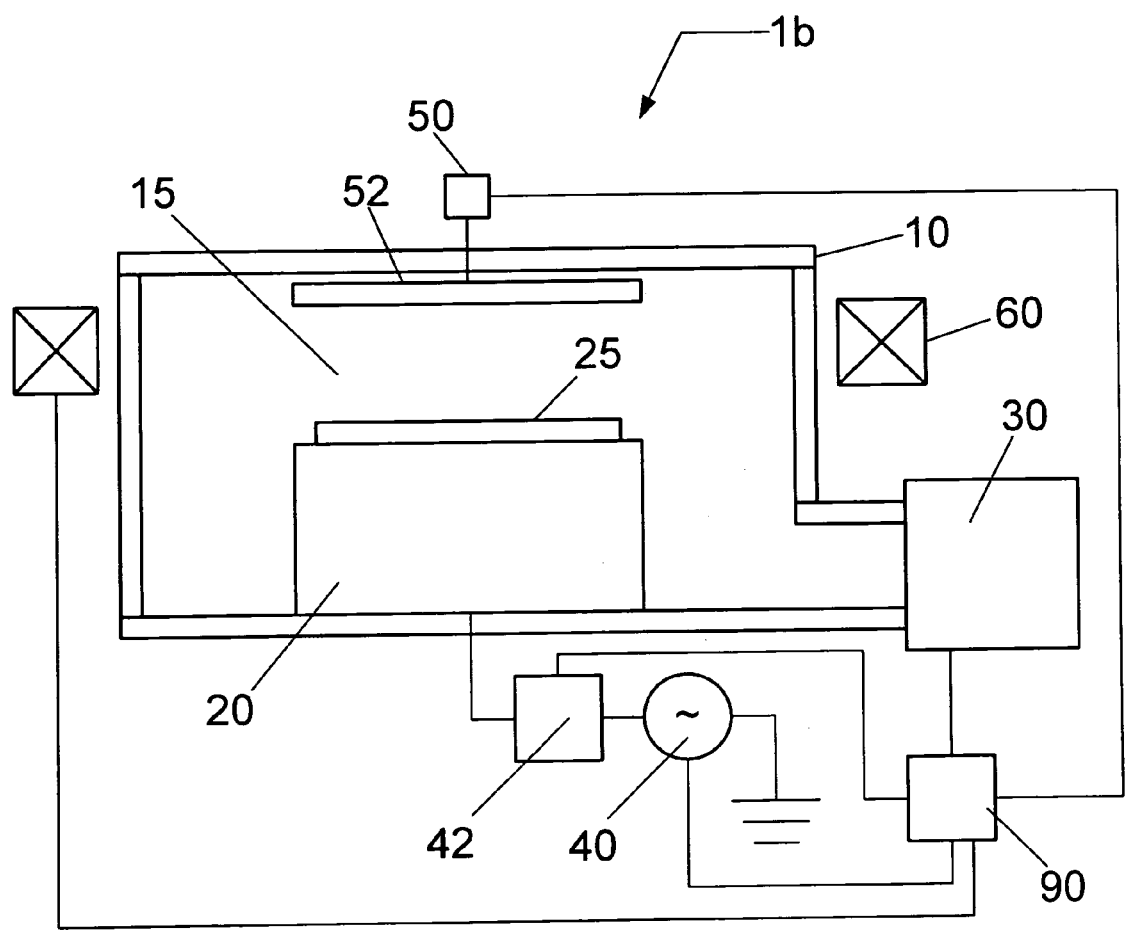
FIG. 4 shows a schematic diagram of a plasma processing system according to another embodiment.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity. Moreover, controller 90 can be coupled to magnetic field system 60 in order to regulate the speed of rotation and field strength. The design and implementation of a rotating magnetic field is well known to those skilled in the art.

Figure 5:
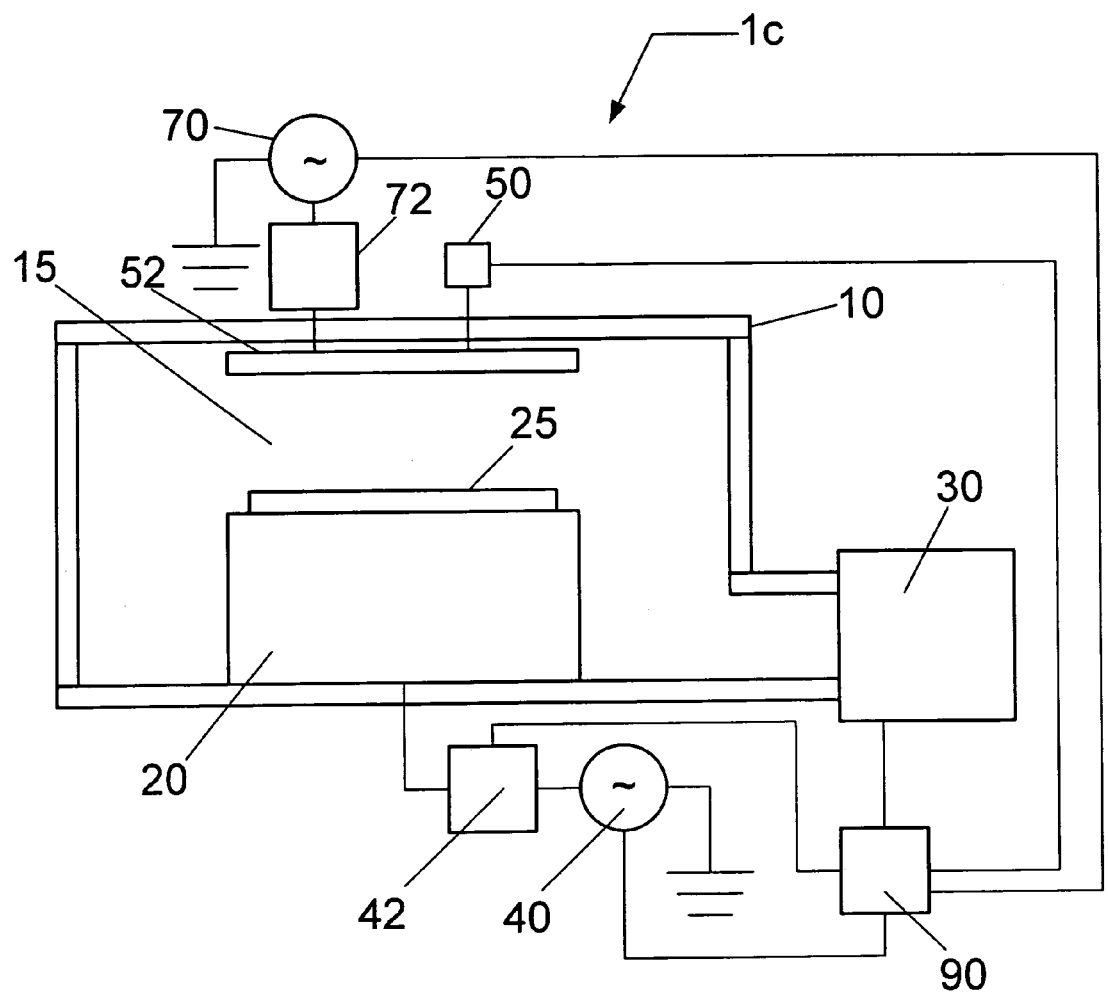
FIG. 5 shows a schematic diagram of a plasma processing system according to another embodiment.

In the embodiment shown in FIG. 5, the plasma processing system 1c can be similar to the embodiment of FIG. 2 or FIG. 3, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 5, the optional DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 6:
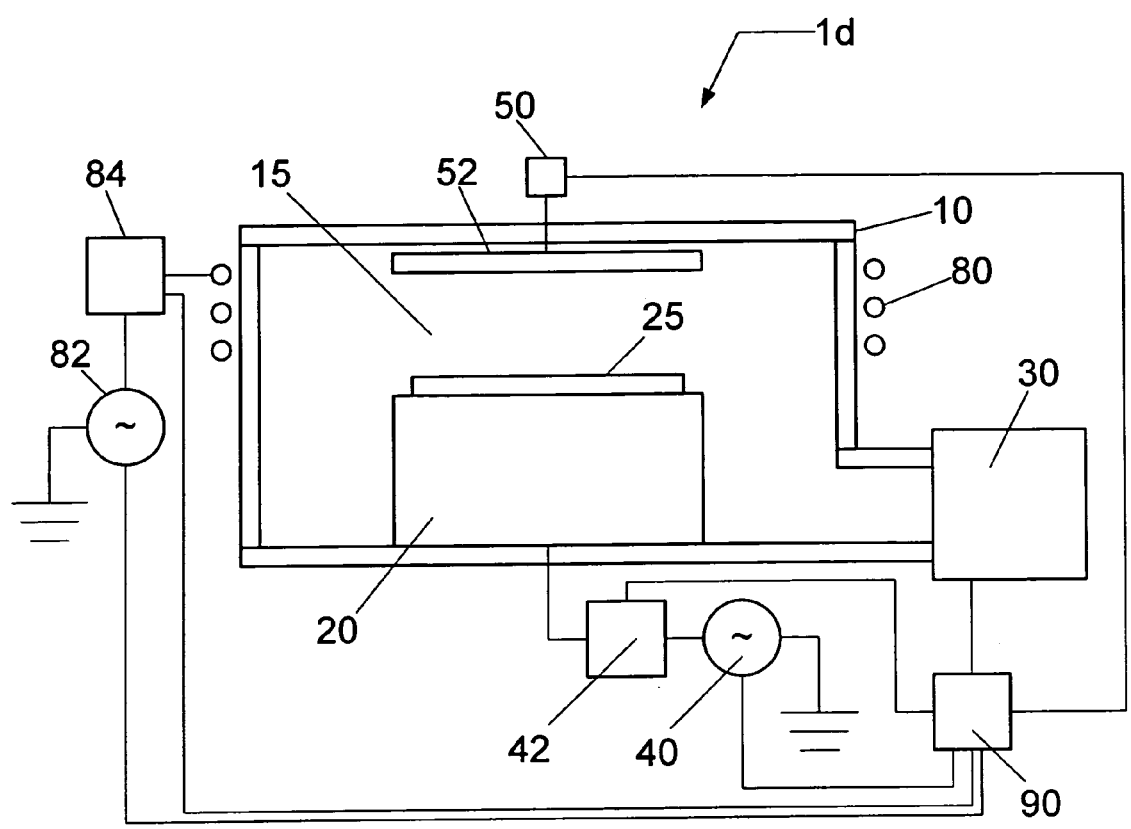
FIG. 6 shows a schematic diagram of a plasma processing system according to another embodiment.

In the embodiment shown in FIG. 6, the plasma processing system 1d can, for example, be similar to the embodiments of FIGS. 2, 3 and 4, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the substrate holder 20 (or lower electrode) can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7:
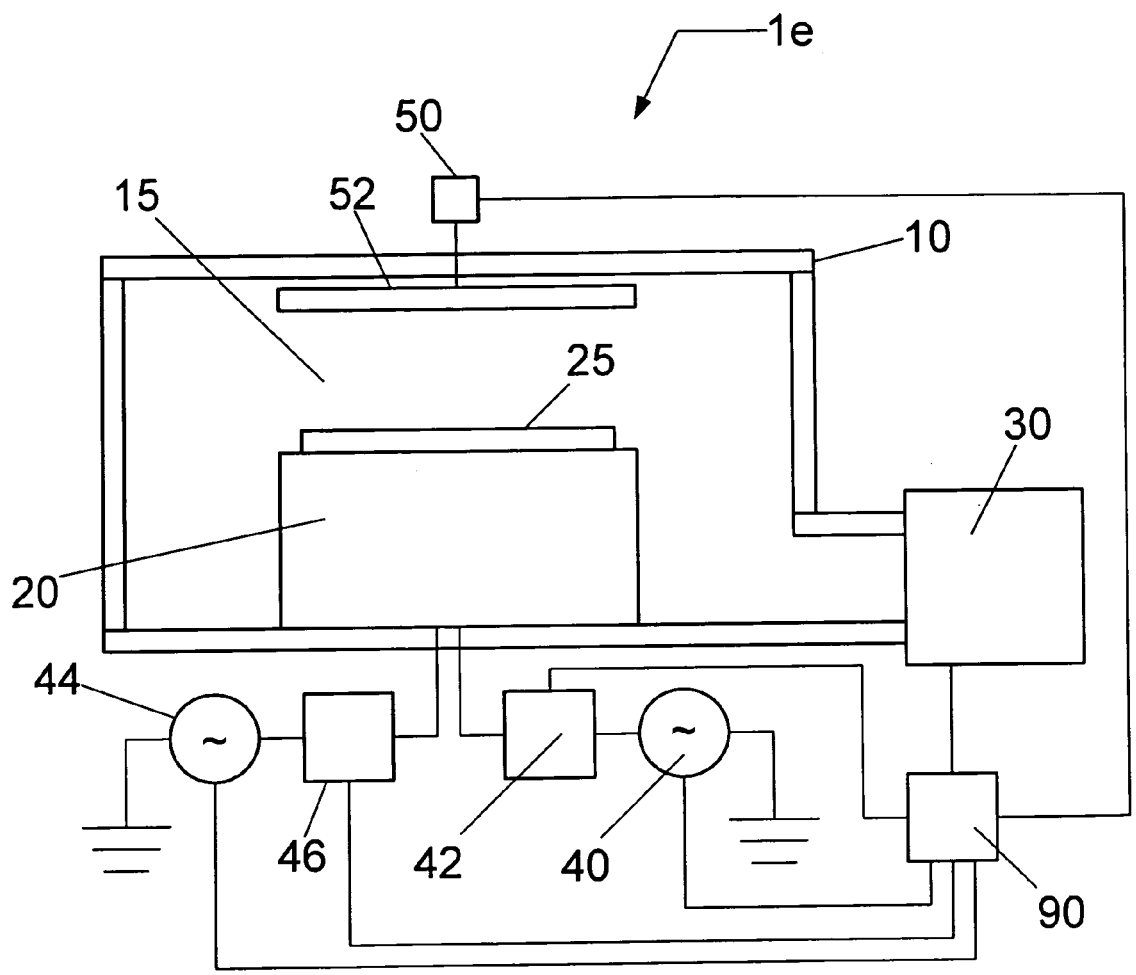
FIG. 7 shows a schematic diagram of a plasma processing system according to another embodiment.

In the embodiment shown in FIG. 7, the plasma processing system 1e can, for example, be similar to the embodiments of FIGS. 3, 4 and 5, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

In the following discussion, a method of etching a hafnium containing layer utilizing a plasma processing device is presented. For example, the plasma processing device can comprise various elements, such as described in FIGS. 2 through 7, and combinations thereof.

In one embodiment, the method of etching a hafnium containing layer, such as a $HfO_2$ layer, comprises using a process composition including $BCl_3$ and an additive gas. The additive gas can comprise an oxygen containing gas, a nitrogen containing gas, or a hydrocarbon gas (characterized by $C_xH_y$, wherein x and y are integers greater than or equal to unity), or a combination of two or more thereof. For example, the oxygen containing gas can comprise $O_2$, NO, $NO_2$, $N_2O$, CO, or $CO_2$, or a combination of two or more thereof. Additionally, for example, the nitrogen containing gas can comprise $N_2$, or $NH_3$, or a combination of two or more thereof. Furthermore, the hydrocarbon gas can comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition can further include an inert gas, such as a noble gas (e.g., He, Ne, Ar, Kr, Xe).

For example, a process parameter space can comprise a chamber pressure of about 5 to about 1000 mTorr, a $BCl_3$ process gas flow rate ranging from about 1 to about 500 sccm, an $O_2$ process gas flow rate ranging from about 1 to about 500 sccm, a $N_2$ process gas flow rate ranging from about 1 to about 500 sccm, a hydrocarbon ($C_xH_y$) process gas flow rate ranging from about 1 to about 500 sccm, an Ar process gas flow rate ranging from about 10 to about 500 sccm, an upper electrode (UEL) (e.g., element 52 in FIG. 5) RF bias ranging from about 0 to about 2000 W, and a lower electrode (LEL) (e.g., element 20 in FIG. 5) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

In one example, a method of etching a $HfO_2$ layer utilizing a plasma processing device such as the one described in FIG. 5 is presented. However, the methods discussed are not to be limited in scope by this exemplary presentation. Table 1 presents the upper electrode (UEL) RF power (watts, W), the lower electrode (LEL) RF power (W), the pressure (p; millitorr, mTorr), the substrate temperature (T, °C.), the $BCl_3$ flow rate (standard cubic centimeters per minute, sccm), the Ar flow rate (sccm), the $O_2$ flow rate (sccm), the $N_2$ flow rate (sccm), the $CH_4$ flow rate (sccm), and the etch time (seconds, sec). Additionally, Table 1 presents the $HfO_2$ etch rate (angstroms per minute, A/min), the poly-Si etch rate (A/min), the $SiO_2$ etch rate (A/min), the etch selectivity of $HfO_2$ to Poly-Si ($HfO_2$/Poly-Si), and the etch selectivity of $HfO_2$ to $SiO_2$ ($HfO_2$/$SiO_2$).

Other process conditions for each of the process recipes listed in Table 1 include: UEL temperature (e.g., electrode 52 in FIG. 5)=80 degrees C.; and Chamber wall temperature=50 degrees C.

TABLE 1

| UEL RF (W) | LEL RF (W) | p (mTorr) | T (° C.) | BCl$_3$ (sccm) | Ar (sccm) | O$_2$ (sccm) | N$_2$ (sccm) | CH$_4$ (sccm) | Etch time (sec) | HfO$_2$ E/R (A/min) | Poly-Si E/R (A/min) | SiO$_2$ E/R (A/min) | HfO$_2$/SiO$_2$ | HfO$_2$/Poly Si |
|---|---|---|---|---|---|---|---|---|---|---|---|---|---|---|
| 200 | 25 | 10 | 200 | 190 | 0 | 0 | 0 | 0 | 15 | 55.7 | −17.8 | 27.7 | 2 | Deposition |
| 200 | 25 | 10 | 200 | 177 | 0 | 0 | 0 | 5 | 15 | 41.8 | −62.2 | 23.3 | 1.8 | Deposition |
| 200 | 25 | 10 | 200 | 177 | 0 | 0 | 0 | 13 | 15 | 28.3 | −61.9 | −4.76 | Deposition | Deposition |
| 200 | 25 | 10 | 200 | 175 | 0 | 0 | 0 | 15 | 15 | 10.01 | −63.4 | −15.1 | Deposition | Deposition |
| 200 | 25 | 10 | 200 | 160 | 0 | 0 | 0 | 30 | 15 | −37.4 | −61.5 | −79 | Deposition | Deposition |
| 200 | 25 | 10 | 200 | 175 | 0 | 15 | 0 | 0 | 15 | 10.6 | 13 | 4.4 | 2.4 | 0.8 |
| 200 | 25 | 10 | 200 | 160 | 0 | 30 | 0 | 0 | 15 | 0.9 | −53.3 | −68.6 | Deposition | Deposition |
| 200 | 25 | 10 | 200 | 177 | 100 | 0 | 0 | 13 | 15 | 31 | −60.5 | 9 | 3.4 | Deposition |
| 200 | 25 | 10 | 200 | 177 | 0 | 0 | 100 | 13 | 15 | 23.3 | −44.3 | 0.8 | 29.5 | Deposition |

As shown in Table 1, the use of O$_2$ as an additive gas, the use of CH$_4$ as an additive gas, and the use of N$_2$ in combination with CH$_4$ as an additive gas affect relatively high etch selectivity between both HfO$_2$ and Poly-Si, and HfO$_2$ and SiO$_2$. For example, the third process condition (i.e., UEL power=200 W; LEL power=25 W; p=10 mTorr; T=200° C.; BCl$_3$=177 sccm; and CH$_4$=13 sccm) exhibits a relatively high HfO$_2$ etch rate of 28.3 A/min, while not etching the Poly-Si and SiO$_2$ (deposition condition). As also seen in Table 1, the relative flow rates of BCl$_3$ and additive gas can be adjusted to provide different etch characteristics for HfO$_2$, Poly-Si and SiO$_2$. For example, in the process of Table 1, a relatively high ratio of BCl$_3$ to CH$_4$ flow rates (process condition 2 for example) will cause excessive etching of SiO$_2$, while a relatively low ratio of BCl$_3$ to CH$_4$ flow rates (process condition 5 for example) will cause insufficient etching of HfO$_2$. Thus, in a preferred embodiment, the flow rates of BCl$_3$ and additive gas are adjusted to provide an etch selectivity between HfO$_2$ and Poly-Si of 10 or greater and an etch selectivity between HfO$_2$ and SiO$_2$ of 10 or greater. Alternatively, the relative flow rates of BCl$_3$ and additive gas are adjusted to provide an etch selectivity either between HfO$_2$ and Poly-Si, or between HfO$_2$ and SiO$_2$ of 30 or greater, or providing an etch selectivity for both of these at 30 or greater.

It is to be understood that the relative flow rates of BCl$_3$ and additive gas may vary for process parameters different than those used in the examples of Table 1, and may vary based on the structure to be etched. Thus, while Table 1 does not provide the precise relative flow rates of BCl$_3$ and additive gas for achieving the desired selectivity, such table discloses the effects of BCl$_3$ and additive gas flow rates in sufficient detail that one of ordinary skill in the art can determine the desired flow rates for a particular etch process. For example, design of experiments (DOE) can be performed to determine the desired relative flow rates for a particular etch process.

Figure 8A:
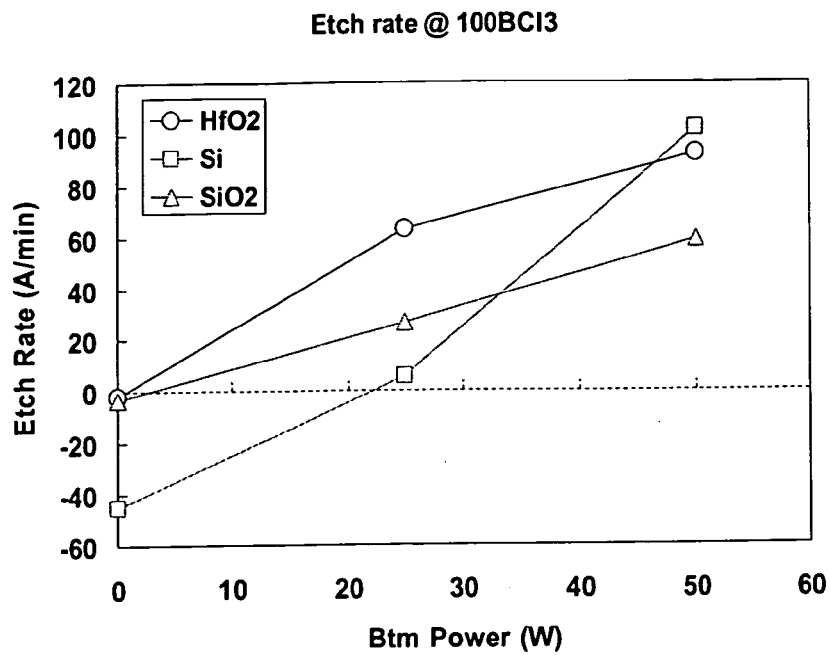
FIGS. 8A through 8G illustrate exemplary process data for etching a hafnium containing layer.
Figure 8B:
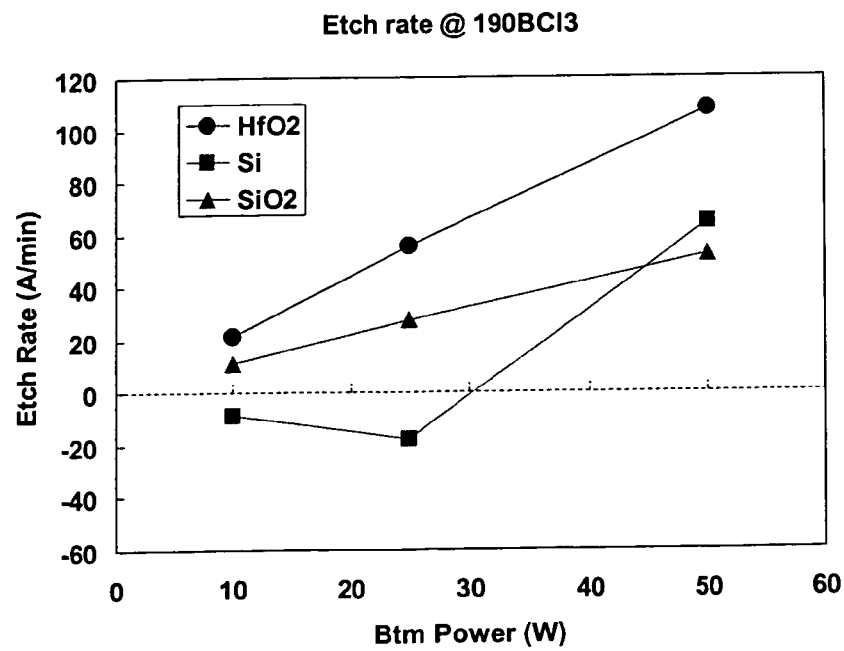

According to another example, FIGS. 8A and 8B illustrate the effect of BCl$_3$ flow rate and lower electrode (LEL) power on HfO$_2$, Poly-Si and SiO$_2$ etch rate. The inventors have observed that the RF power coupled to the lower electrode (LEL) can be utilized to adjust the HfO$_2$ etch rate, i.e., the HfO$_2$ etch rate increases with LEL power. Additionally, the inventors have observed that with the use of a relatively high BCl$_3$ flow rate, the LEL RF power can be adjusted to provide a relatively high etch selectivity between HfO$_2$ and Poly-Si. For instance, when using a process condition of UEL power=200 W; p=10 mTorr; flow rate of BCl$_3$=100 sccm; and T=200° C., a variation of the LEL power from approximately 10 W to approximately 50 W affects a deposition condition for the Poly-Si up to approximately 22 W of LEL power (see FIG. 8A). Alternatively, while increasing the flow rate of BCl$_3$ from 100 sccm to 190 sccm and varying the LEL power from approximately 10 W to approximately 50 W, the inventors observed a deposition condition on the Poly-Si up to approximately 30 W of LEL power (see FIG. 8B). Therefore, by increasing the flow rate of BCl$_3$, the inventors can operate at a higher LEL power to achieve a higher etch rate of HfO$_2$ while maintaining a deposition condition on the Poly-Si.

Figure 8C:
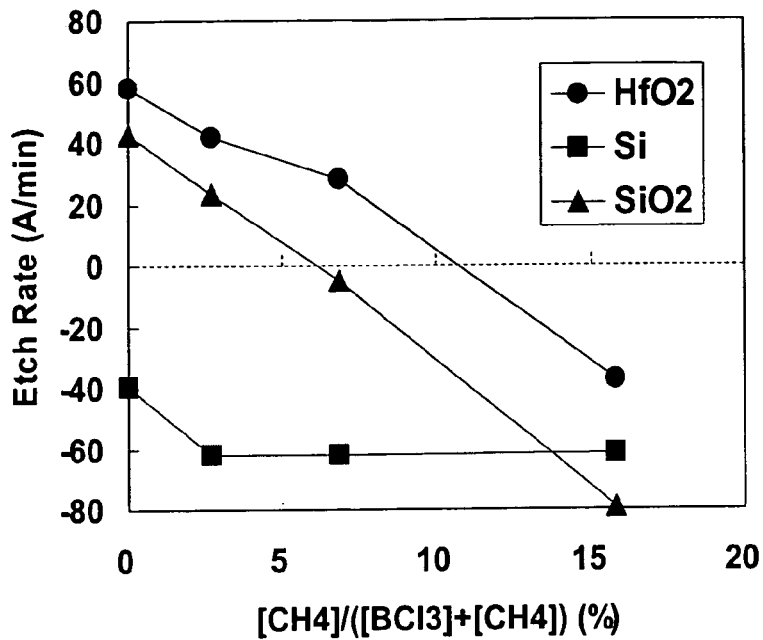
Figure 8D:
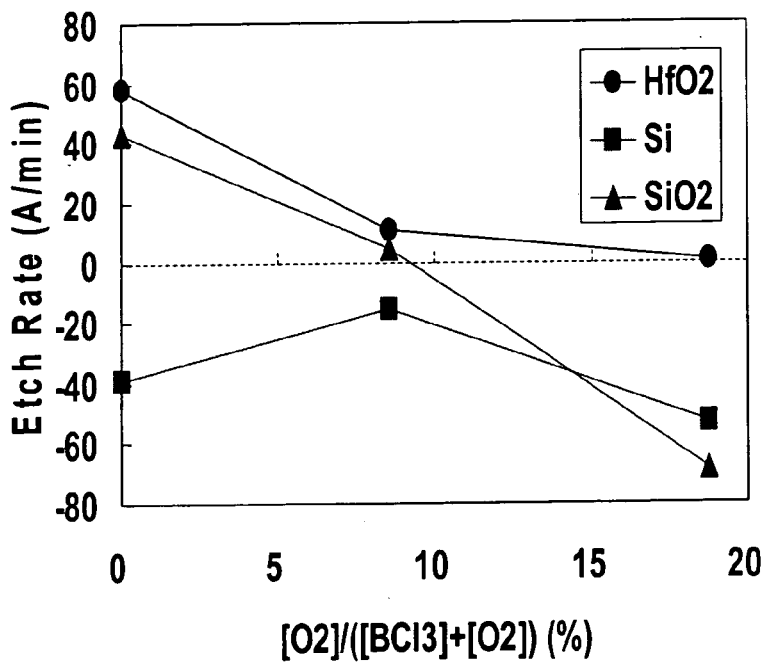
Figure 8E:
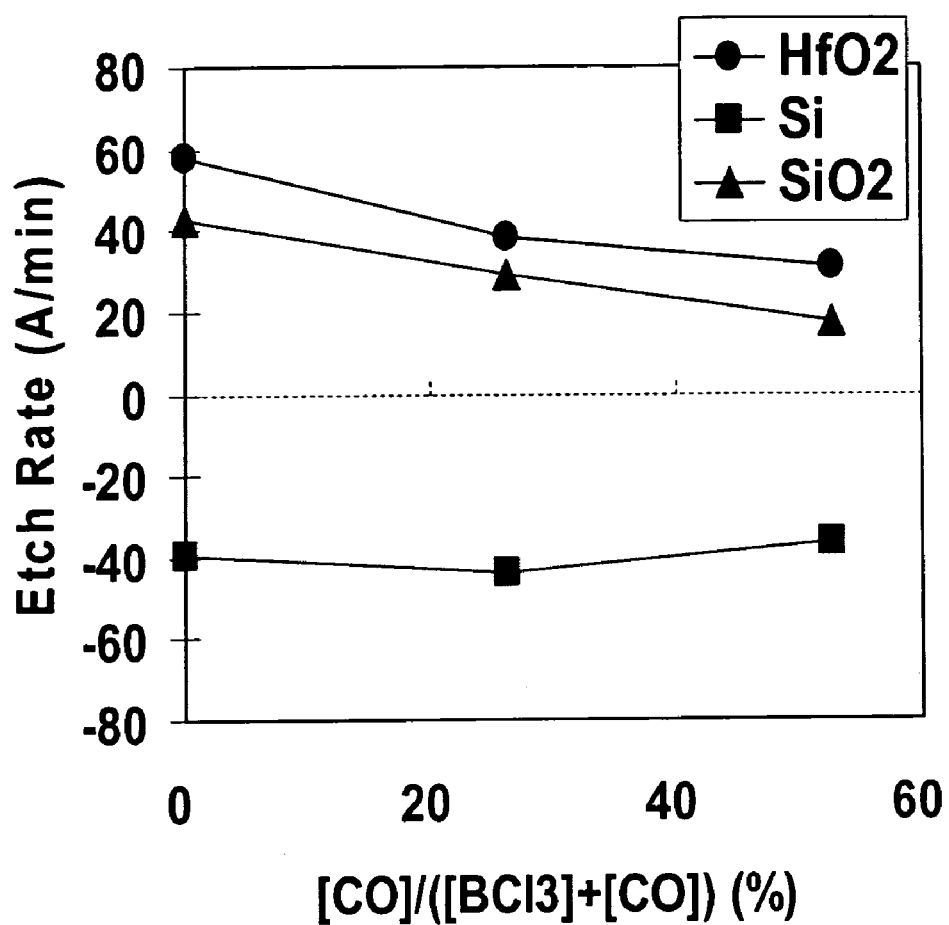

According to another example, FIGS. 8C, 8D and 8E illustrate the effect of an additive gas (to BCl$_3$) on HfO$_2$, Poly-Si and SiO$_2$ etch rate. The inventors have observed that, when using a process condition of UEL power=200 W; LEL power=25 W; p=10 mTorr; flow rate of BCl$_3$=190 sccm; and T=200° C., the addition of CH$_4$ to the flow of BCl$_3$ can affect etching of HfO$_2$, while maintaining a deposition condition for Poly-Si and SiO$_2$ (see FIG. 8C). Additionally, the inventors have observed that, when using a process condition of UEL power=200 W; LEL power=25 W; p=10 mTorr; flow rate of BCl$_3$=190 sccm; and T=200° C., the addition of O$_2$ to the flow of BCl$_3$ can affect etching of HfO$_2$, while maintaining a deposition condition for Poly-Si and SiO$_2$ (see FIG. 8D). Additionally yet, the inventors have observed that, when using a process condition of UEL power=200 W; LEL power=25 W; p=10 mTorr; flow rate of BCl$_3$=190 sccm; and T=200° C., the addition of CO to the flow of BCl$_3$ can affect etching of HfO$_2$ and can affect an increase in the etch selectivity between HfO$_2$ and SiO$_2$, while maintaining a deposition condition for Poly-Si and SiO$_2$ (see FIG. 8E).

Figure 8F:
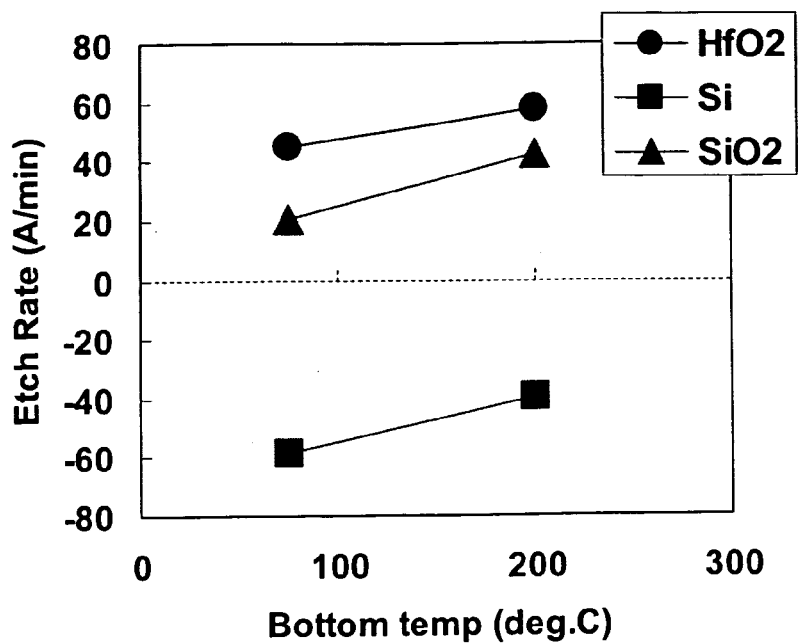
Figure 8G:
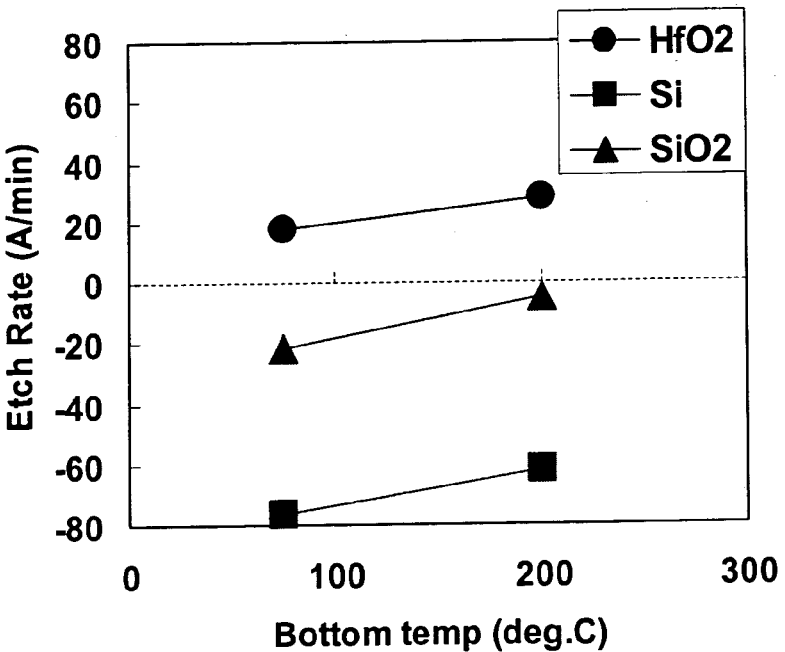

According to yet another example, FIGS. 8F and 8G illustrate the effect of substrate temperature on HfO$_2$, Poly-Si and SiO$_2$ etch rate. The inventors have observed that, under some process conditions including an additive gas, variation of the substrate temperature from approximately 75 degrees C. to approximately 200 degrees C. causes an increase in the HfO$_2$ etch rate, while maintaining a deposition condition for Poly-Si and SiO$_2$. Additionally, the inventors have observed that, under some process conditions excluding an additive gas, variation of the substrate temperature from approximately 75 degrees C. to approximately 200 degrees C. causes an increase in the HfO$_2$ etch rate, while maintaining a deposition condition for Poly-Si and maintaining about the same etch selectivity between HfO$_2$ and SiO$_2$. For instance, when using a process condition of UEL power=200 W; LEL power=50 W; p=10 mTorr; flow rate of BCl$_3$=177 sccm; and a flow rate of CH$_4$=13 sccm, a variation in the substrate temperature from approximately 75 degrees C. to approximately 200 degrees C. affects an increase in the HfO$_2$ etch rate (from approximately 20 Angstroms per minute to approximately 30 Angstroms per minute), while maintaining a deposition condition for Poly-Si and $SiO_2$ (see FIG. 8G). Additionally, for instance, when using a process condition of UEL power=200 W; LEL power=50 W; p=10 mTorr; and flow rate of $BCl_3$=190 sccm, a variation in the substrate temperature from approximately 75 degrees C. to approximately 200 degrees C. affects an increase in the $HfO_2$ etch rate (from approximately 45 Angstroms per minute to approximately 60 Angstroms per minute), while maintaining a deposition condition for Poly-Si about the same etch selectivity between $HfO_2$ and $SiO_2$ (see FIG. 8F).

Figure 9:
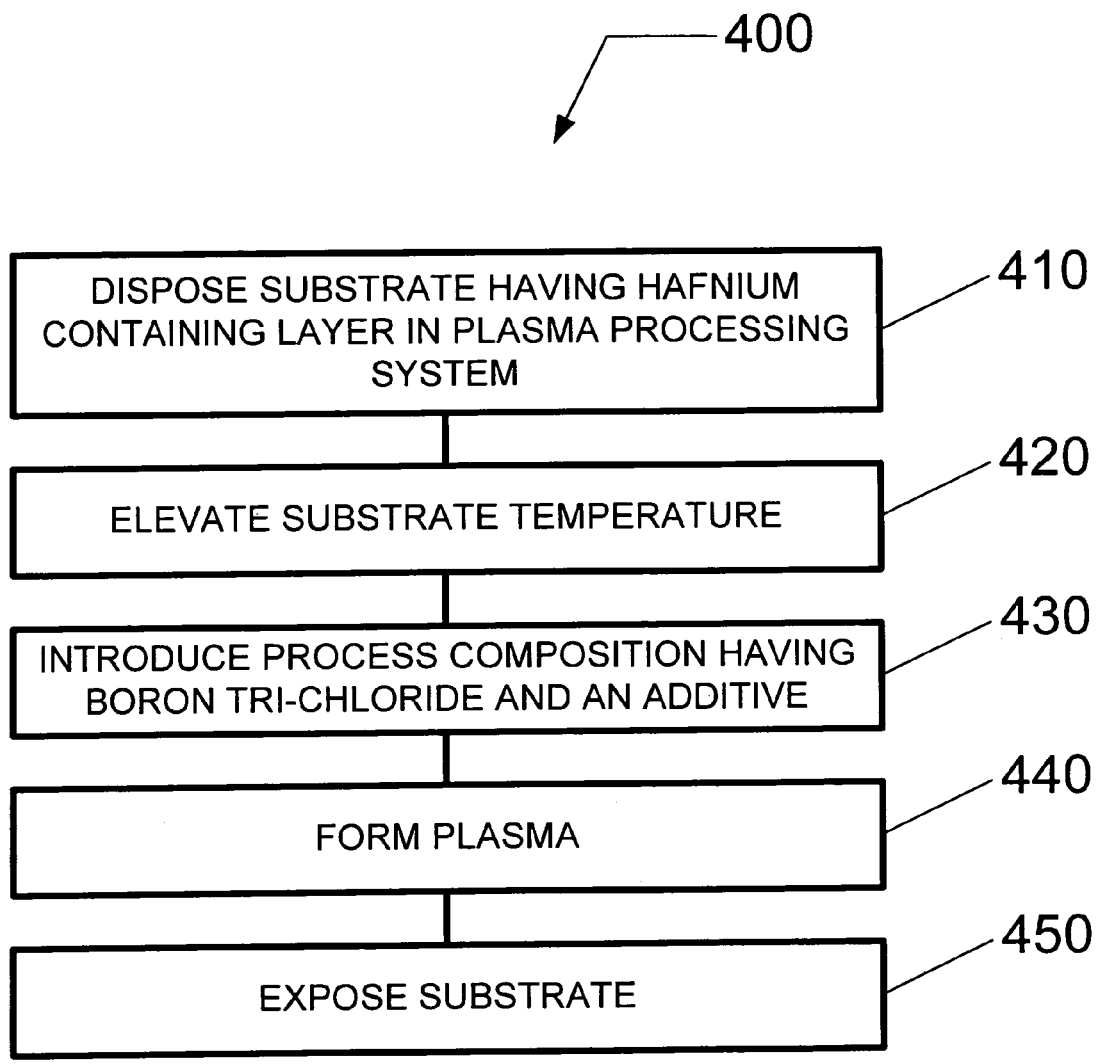
FIG. 9 presents a method of etching a hafnium containing layer on a substrate in a plasma processing system according to an embodiment.

FIG. 9 presents a flow chart of a method of etching a hafnium containing layer on a substrate in a plasma processing system according to an embodiment of the present invention. Procedure 400 begins in 410 with disposing a substrate having a hafnium containing layer thereon in a plasma processing system. The plasma processing system may, for example, comprise any one of the systems described in FIGS. 2 through 7, and combinations thereof.

In 420, the temperature of the substrate is elevated to the process temperature. The temperature of the substrate can be elevated to a temperature of approximately 30 degrees C. or greater. Alternatively, the temperature of the substrate can be elevated to a temperature of approximately 50 degrees C. or greater. Alternatively, the temperature of the substrate can be elevated to a temperature of approximately 75 degrees C. or greater. Alternatively yet, the temperature of the substrate can be elevated to a temperature of approximately 100 degrees C. or greater, or even 200 degrees C. or greater. For example, the substrate temperature may range from approximately 50 degrees C. to approximately 250 degrees, and can range from approximately 50 degrees C. to approximately 100 degrees C.

In 430, a process composition comprising $BCl_3$ and an additive gas is introduced. The additive gas can comprise an oxygen containing gas, a nitrogen containing gas, or a hydrocarbon gas (characterized by $C_xH_y$, wherein x and y are integers greater than or equal to unity), or a combination of two or more thereof. For example, the oxygen containing gas can comprise $O_2$, NO, $NO_2$, $N_2O$, CO, or $CO_2$, or a combination of two or more thereof. Additionally, for example, the nitrogen containing gas can comprise $N_2$, or $NH_3$, or a combination of two or more thereof. Furthermore, the hydrocarbon gas can comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition can further include an inert gas, such as a noble gas (e.g., He, Ne, Ar, Kr, Xe).

In 440, plasma is formed in the plasma processing system from the process composition.

In 450, the substrate comprising the hafnium containing layer is exposed to the plasma formed in 440 in order to pattern etch the hafnium containing layer.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of etching a gate stack on a substrate, said gate stack including a silicon dioxide layer, a hafnium containing layer including $HfO_2$ and a poly-crystalline silicon layer, the method comprising:

disposing said substrate having said gate stack, said gate stack including said silicon dioxide layer, said hafnium containing layer including $HfO_2$ and said poly-crystalline silicon layer in a plasma processing system, wherein a mask layer defining a pattern therein overlies said gate stack;

elevating the temperature of said substrate above approximately 30 degrees C.;

introducing a process composition comprising $BCl_3$ and an additive gas to said plasma processing system, the additive gas comprising an oxygen-containing gas, a nitrogen containing gas, or a hydrocarbon gas characterized by $C_xH_y$, wherein x and y are integers greater than or equal to unity, or a combination of two or more thereof;

adjusting the flow rates of $BCl_3$ and the additive gas to a predetermined level for achieving an etch selectivity between said hafnium containing layer and said poly-crystalline silicon layer on the substrate of greater than or equal to approximately 10-to-1, and at the same predetermined level achieving an etch selectivity between said hafnium containing layer and said $SiO_2$ layer on the substrate of greater than or equal to approximately 10-to-1;

forming a plasma from said process composition in said plasma processing system; and exposing said substrate to said plasma in order to etch said pattern into said hafnium containing layer while simultaneously suppressing etching of the poly-crystalline silicon layer and the silicon dioxide layer.

2. The method of claim 1, wherein said introducing said process composition further comprises introducing an inert gas.

3. The method of claim 2, wherein said introducing said inert gas comprises introducing a noble gas.

4. The method of claim 1, wherein said introducing said additive gas comprises introducing an oxygen containing gas comprising $O_2$, NO, $NO_2$, $N_2O$, CO, or $CO_2$, or a combination of two or more thereof.

5. The method of claim 1, wherein said introducing said additive gas comprises introducing a nitrogen containing gas comprising $N_2$, or $NH_3$, or a combination of two or more thereof.

6. The method of claim 1, wherein said introducing said additive gas comprises introducing a hydrocarbon gas comprising $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof.

7. The method of claim 1, wherein said introducing said additive gas comprises introducing $CH_4$.

8. The method of claim 1, wherein said introducing said additive gas comprises introducing $CH_4$ and $N_2$.

9. The method of claim 1, wherein said elevating the temperature of said substrate comprises elevating the temperature to approximately 50 degrees C. and greater.

10. The method of claim 1, wherein exposing said substrate to said plasma comprises achieving an etch selectivity between said hafnium containing layer and said poly-crystalline silicon layer greater than or equal to approximately 10-to-1, and achieving an etch selectivity between said hafnium containing layer and said $SiO_2$ layer greater than or equal to approximately 30-to-1.

11. The method of claim 1, wherein said forming said plasma comprises capacitively coupling power to said plasma, or inductively coupling power to said plasma, or a combination of two or more thereof.

12. The method of claim 1, wherein said forming said plasma comprises coupling radio frequency (RF) power to a substrate holder upon which said substrate rests.

13. The method of claim 12, further comprising adjusting a power level of said RF power to a predetermined level in order to achieve said etch selectivity between said hafnium containing layer and said poly-crystalline silicon layer greater than or equal to approximately 10-to-1, and said etch selectivity between said hafnium containing layer and said $SiO_2$ layer greater than or equal to approximately 10-to-1.

14. The method of claim 13, wherein the power on the substrate holder is between approximately 10 W and approximately 50 W.

15. The method of claim 14, wherein the flow rate of $BCl_3$ is 100 sccm and the power on the lower electrode is 22 W.

16. The method of claim 14, wherein the flow rate of $BCl_3$ is 190 sccm and the power on the lower electrode is 30 W.

17. The method of claim 1, wherein said forming said plasma comprises coupling radio frequency (RF) power to an electrode positioned opposite a substrate holder upon which said substrate rests.

18. The method of claim 1, wherein said elevating the temperature of said substrate comprises elevating the temperature to approximately 75 degrees C. and greater.

19. The method of claim 1, wherein said elevating the temperature of said substrate comprises elevating the temperature to approximately 100 degrees C. and greater.

20. The method of claim 1, wherein said elevating the temperature of said substrate comprises elevating the temperature to approximately 200 degrees C.

* * * * *